United States Patent
Tseng

(10) Patent No.: US 6,677,224 B2
(45) Date of Patent: Jan. 13, 2004

(54) METHOD OF FORMING STACKED GATE FOR FLASH MEMORIES

(76) Inventor: Horng-Huei Tseng, 5Fl., No. 25, Lane 281, Jungyang Rd., Hsinchu 300 (TW)

( * ) Notice: Subject to any disclaimer, the term of this patent is extended or adjusted under 35 U.S.C. 154(b) by 0 days.

(21) Appl. No.: 09/976,823

(22) Filed: Oct. 12, 2001

(65) Prior Publication Data

US 2003/0073291 A1 Apr. 17, 2003

(51) Int. Cl.$^7$ ............... H01L 21/3205; H01L 21/4763
(52) U.S. Cl. ............. 438/593; 438/257; 438/296; 438/267; 438/592; 438/594; 438/589
(58) Field of Search ................ 438/592, 296, 438/257–267, 589, 593, 594

(56) References Cited

U.S. PATENT DOCUMENTS

| | | | | |
|---|---|---|---|---|
| 5,733,383 A | * | 3/1998 | Fazan et al. | |
| 5,767,005 A | * | 6/1998 | Doan et al. | |
| 6,054,733 A | * | 4/2000 | Doan et al. | |
| 6,180,459 B1 | * | 1/2001 | Sheu | |
| 6,281,103 B1 | * | 8/2001 | Doan | |
| 6,448,606 B1 | * | 9/2002 | Yu et al. | |

* cited by examiner

*Primary Examiner*—Long Pham
(74) *Attorney, Agent, or Firm*—Clement Cheng

(57) ABSTRACT

The method of the present invention includes the steps of forming doped regions in the semiconductor substrate. A pad oxide layer is formed on the semiconductor substrate. A masking layer is formed on the pad oxide layer. A masking layer, the pad oxide layer and the semiconductor substrate are patterned to form a trench therein. A gap-filling material is refilled into the trench and over the semiconductor substrate. A portion of the gap-filling material is removed to an upper surface of the masking layer. Next step is to remove the masking layer. A first conductive layer is formed along the surface of the substrate, then removing a portion of the first conductive layer to expose an upper surface of the gap-filling material. An inter polysilicon dielectric layer is formed on the first conductive layer and a second conductive layer is formed on the inter polysilicon dielectric layer.

15 Claims, 3 Drawing Sheets

METHOD OF FORMING STACKED GATE FOR FLASH MEMORIES

The present invention relates to a semiconductor device, and more specifically, to a method of fabricating flash memories.

BACKGROUND OF THE INVENTION

The semiconductor industry has been advanced to the field of Ultra Large Scale Integrated (ULSI) technologies. The fabrication of the nonvolatile memories also follows the trend of the reduction of the size of a device. The nonvolatile memories include various types of devices, such as EAROM (electrically alterable read only memory), EEPROM (electrically erasable programmable read only memory), EEPROM-EAROMs and non-volatile SRAMs. Different types of devices have been developed for specific applications requirements in each of these segments. These parts have been developed with a focus on the high endurance and high-speed requirements. Various nonvolatile memories have been disclosed in the prior art. For example, Mitchellx has proposed EPROMs with self-aligned planar array cell. In this technique, buried diffusion self-aligned to the floating gate avalanche injection MOS transistors are used for the bit lines. Cross point array technology has been disclosed. The self-aligned source and drain will allow this device to be optimized even further for programming speed. See A. T. Mitchellx, "A New Self-Aligned Planar Cell for Ultra High Density EPROMs", IEDM, Tech. pp. 548–553, 1987".

Flash memory is one of the segments of nonvolatile memory devices. The device includes a floating gate to storage charges and an element for electrically placing charge on and removing the charges from the floating gate. One of the applications of flash memory is BIOS for computer. Typically, the high-density nonvolatile memories can be applied as the mass storage of portable handy terminals, solid state camera and PC cards. That is because that the nonvolatile memories exhibit many advantages, such as a fast access time, low power dissipation, and robustness. Bergemont proposed another cell array for portable computing and telecommunications application, which can be seen in Bergmont et al., "Low Voltage NVG™: A New High Performance 3 V/5 V Flash Technology for Portable Computing and Telecommunications Applications", IEEE Trans. Electron Devices, vol. ED-43, p. 1510, 1996. This cell structure is introduced for low voltage NOR Virtual Ground (NVG) flash memory having fast access time. In the flash array schematic, field oxides (FOX) are formed between cells such that a poly extension on FOX of each cell provides adequate gate coupling ratio. Bergmont also mentioned that the portable telecommunications and computing have become a major driving force in the field of integrated circuits. In the article, the access time is one of the key concerns for low voltage read operation. The NVG array uses select devices to achieve a fast access time by reducing the pre-charge time to that of a single segment rather than the full bit-line.

The formation of nonvolatile memories toward the trends of low supply power and fast access, because these requirements are necessary for the application of the mobile computing system. Flash memory needs the charges to be hold in the floating gate for a long periods of time. Therefore, the dielectric that is used for insulating the floating gate needs to be high performance. At present, the low voltage flash memory is applied with a voltage of about 3V or 5V during charging or discharging the floating gate. As known in the art, tunneling is a basic technology in charging or discharging. In order to attain high tunneling efficiency, the thickness of the dielectric between the floating gate and substrate have to be scaled down due to the supply voltage is reduced.

U.S. Pat. No. 6,180,459 to Sheu, entitled "Method for fabricating a flash memory with shallow trench isolation", filed on Jan. 8, 1999. The prior art disclosed a method for fabricating a flash memory comprising forming a shallow trench isolation (STI) structure is also formed in the method. A further U.S. Pat. No. 6,172,395 to Chen, et al., entitled "Method of manufacture of self-aligned floating gate, flash memory cell and device manufactured thereby" and assigned to Taiwan Semiconductor Manufacturing Company (Hsin-Chu, TW). U.S. Pat. No. 6,281,103 to Doan entitled "Method for fabricating gate semiconductor". The prior art disclosed a method for fabricating floating gate semiconductor devices, such as flash EEPROMs, and flash EEPROM memory arrays, is provided. The method includes providing a semiconductor substrate and forming active areas on the substrate. Each active area includes elements of a field effect transistor (FET) including a source, a drain, a channel region, and a gate dielectric layer. Trench isolation structures are also formed in the substrate for electrically isolating the active areas. In addition, a conducive layer (e.g., polysilicon) is deposited on the active areas, and chemically mechanically planarized to an endpoint of the trench isolation structures to form self-aligned floating gates on the active areas. Control gate dielectric layers, and control gates are then formed on the floating gates.

SUMMARY OF THE INVENTION

The object of the present invention is to form a stacked gate for flash devices.

The further object of the present invention is to increase the coupling ratio of flash devices.

The method of the present invention includes the steps of forming doped regions in the semiconductor substrate. A pad oxide layer is formed on the semiconductor substrate. A masking layer is formed on the pad oxide layer. A masking layer, the pad oxide layer and the semiconductor substrate are patterned to form a trench therein. A gap-filling material is refilled into the trench and over the semiconductor substrate. A portion of the gap-filling material is removed to upper surface of the masking layer. Next step is to remove the masking layer. A first conductive layer is formed along the surface of the substrate, then removing a portion of the first conductive layer to expose an upper surface of the gap-filling material. An inter polysilicon dielectric layer is formed on the first conductive layer and a second conductive layer is formed on the inter polysilicon dielectric layer. Wherein the masking layer is removed by hot phosphorus acid solution, the inter polysilicon dielectric layer comprises ONO (oxide/nitride/oxide) and ON (oxide/nitride). The first conductive layer comprises polysilicon and the second conductive layer comprises polysilicon. Further, the gap-filling material is removed by chemical mechanical polishing (CMP). The first polysilicon layer is removed by chemical mechanical polishing (CMP).

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 1:
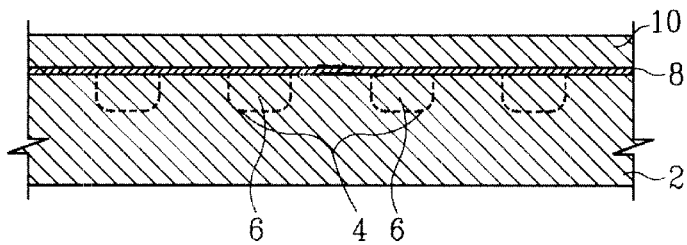
FIG. 1 is a cross sectional view of a semiconductor wafer illustrating the steps of forming source/drain, pad oxide layer and nitride layer in a semiconductor substrate according to the present invention

The present invention process proposes a novel method to fabricate a flash nonvolatile memory. In the method, the coupling ratio can be increased by etching refilling material refilled in trenches. The detail description will be seen as follows. A semiconductor substrate is provided for the present invention. In a preferred embodiment, as shown in the FIG. 1, a single crystal silicon substrate 2 with a <100> or <111> crystallographic orientation is provided. The substrate 2 includes a pattern of active areas 4 comprising separated doped region such as the source/drain regions 6. The active areas 4 and source/drain regions 6 can be formed by performing ion implantation to implant dopants into the substrate 2. The source/drain regions 6 can be formed while forming the source and drain of MOSFET. The step can be integrated with the process of MOS. A thin dielectric layer 8 consisted of silicon dioxide is formed on the substrate 2 to act as pad oxide layer 8. Typically, the pad oxide layer 8 can be grown in oxygen ambient at a temperature of about 700 to 1100 degrees centigrade. Other method, such as chemical vapor deposition, can also form the pad oxide layer 8. In the embodiment, the thickness of the silicon dioxide layer 4 is approximately 50–500 angstroms. Subsequently, a masking layer 10 can be formed on the pad oxide layer 8. One suitable material for the masking layer 10 comprises silicon nitride deposited by CVD. A thickness for the masking layer 10 can be form 500 angstroms to 3000 angstroms. The silicon nitride layer 10 is deposited by any suitable process. For example, Low Pressure Chemical Vapor Deposition (LPCVD), Plasma Enhance Chemical Vapor Deposition (PECVD), High Density Plasma Chemical Vapor Deposition (HDPCVD). In the preferred embodiment, the reaction gases of the step to form silicon nitride layer include $SiH_4$, $NH_3$, $N_2$ or $SiH_2Cl_2$, $NH_3$, $N_2$.

Figure 2:
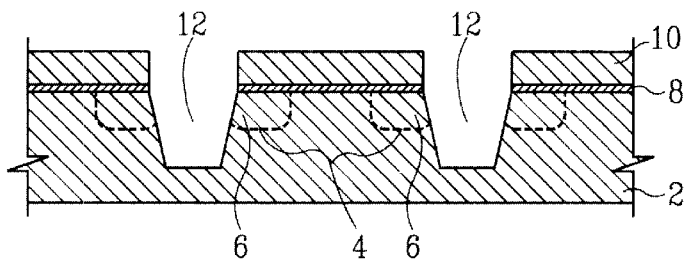
FIG. 2 is a cross sectional view of a semiconductor wafer illustrating the steps of forming trenches in a semiconductor substrate according to the present invention.
Figure 3:
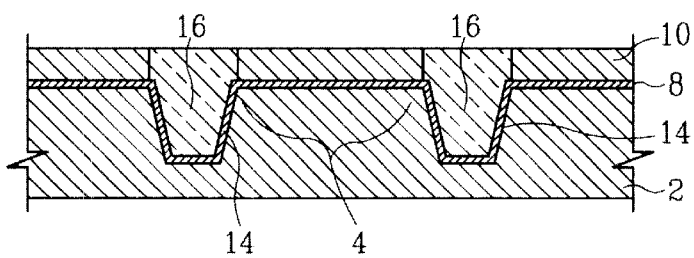
FIG. 3 is a cross sectional view of a semiconductor wafer illustrating the step of forming trench isolation according to the present invention.
Figure 4:
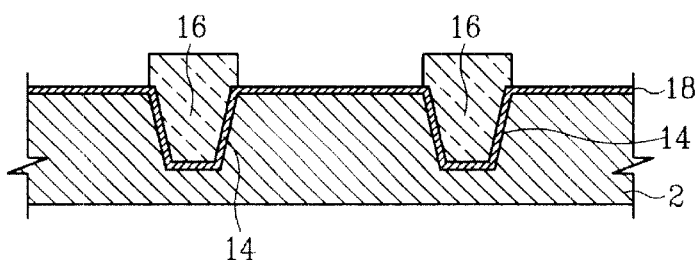
FIG. 4 is a cross sectional view of a semiconductor wafer illustrating the step of removing nitride according to the present invention.

Next, still referring to FIG. 2, standard lithography and etching steps are used to etch the masking layer 10, the thin dielectric layer 8 and into the substrate 2 to a depth to form trenches 12 in the substrate 2. In the step, the source and drain regions 6 are separated by the trenches 12. An insulating layer 14 can be optionally formed within the trenches 12. One suitable material for the insulating layer 14 comprises oxide by thermal oxidation process. The insulating layer 14 removes damage caused by high-energy ion bombardment during the trench-etching step. A gap-filling material 16, such as oxide formed by a CVD system, which is referred to as CVD-oxide, is refilled into the trenches 12 for isolation. Preferably, the oxide layer 16 is formed at a temperature in the range of about 400 to 600 degrees centigrade. A chemical mechanical polishing (CMP) technology is used to remove the top of CVD-oxide 16 to the surface of the nitride layer 10, as shown in FIG. 3. Next, turning to FIG. 4, the nitride layer 10 is removed by hot phosphorus acid solution.

Figure 5:
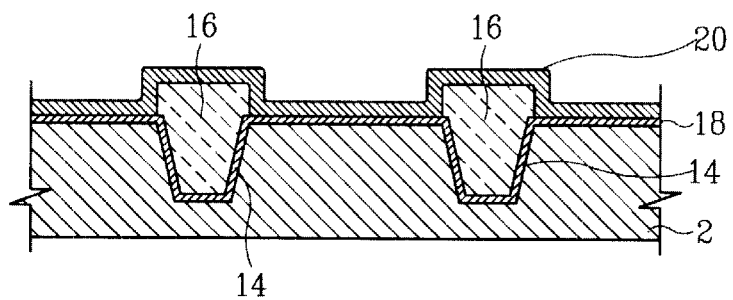
FIG. 5 is a cross sectional view of a semiconductor wafer illustrating the optional step of forming the polysilicon according to the present invention.

Turning to FIG. 5, the pad oxide layer 8 can also be stripped by solution of HF or BOE. With the pad oxide layer 8 stripped, a gate dielectric layer 18 can be formed on the substrate 2. A doped polysilicon layer 20 is deposited on the exposed pad oxide layer 8 and the oxide layer 16. Generally, the doped polysilicon layer 20 is chosen from doped polysilicon or in-situ polysilicon. For an embodiment, the doped polysilicon layer 20 is doped by phosphorous using a PH3 source. A chemical mechanical polishing is used again to polish the doped polysilicon layer 20 to expose the upper surface 21 of the refilling oxide 16.

Figure 6:
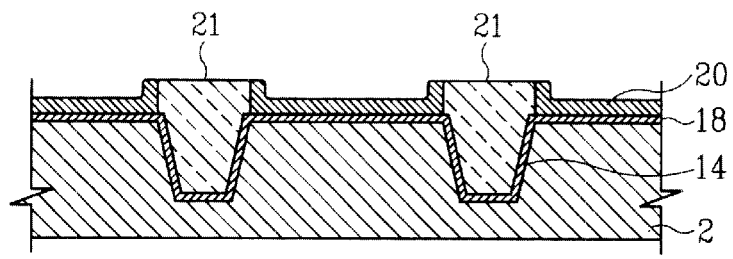
FIG. 6 is a cross section view of a semiconductor wafer illustrating the step of forming inter polysilicon dielectric layer according to the present invention.
Figure 7:
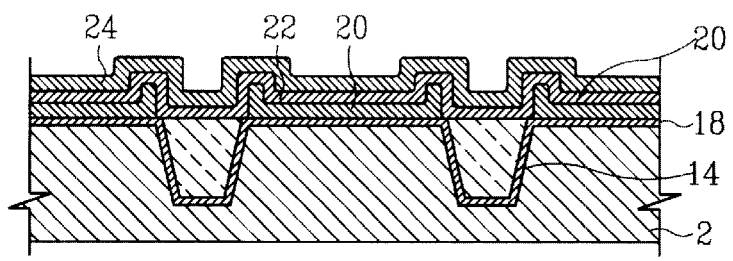
FIG. 7 is a cross section view of a semiconductor wafer illustrating the step of forming control gate according to the present invention.

As shown in FIG. 6, a key step of the present invention is to etch the refilling oxide 16 by using high selective etching between refilling oxide 16 and doped polysilicon layer 20. The step forms a downward portion into the refilling oxide 16, thereby exposing the sidewall surface of the doped polysilicon layer 20. Apparently the coupling surface area of the doped polysilicon layer 20 is increased. Referring to FIG. 7, an inter polysilicon dielectric (IPD) 22 is formed at the top of the floating gate for isolation. ONO (oxide/nitride/oxide) or ON (oxide/nitride) is used as the IPD 22. Finally, a conductive layer, such as doped polysilicon layer or metal 24, is formed on the IPD 22 as control gate. The doped polysilicon layer 24 can be chosen from doped polysilicon or in-situ doped polysilicon. In addition, the metal or alloy layer can be used as the conductive layer.

In the process of this invention, higher coupling can be obtained due to the floating gate formed against the high-step oxide protruding over the isolation trench of the present invention. The side wall of the poly 20 is exposed.

Figure 8:
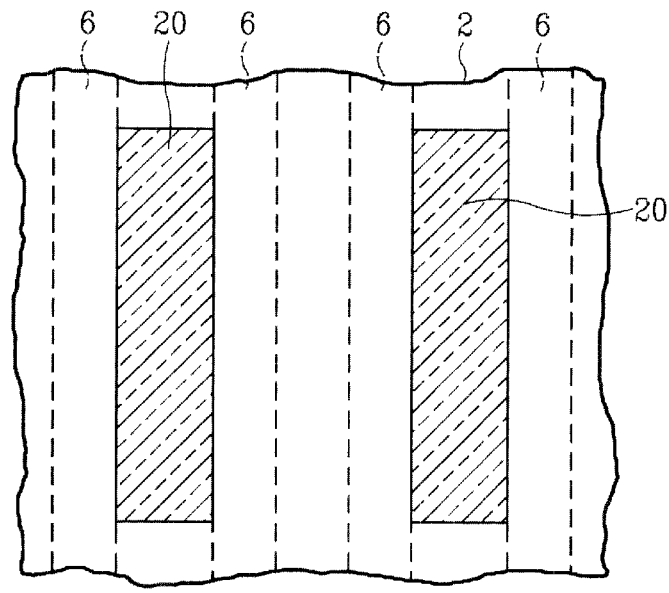
FIGS. 8–9 are layout a memory cell according to the present invention.
Figure 9:
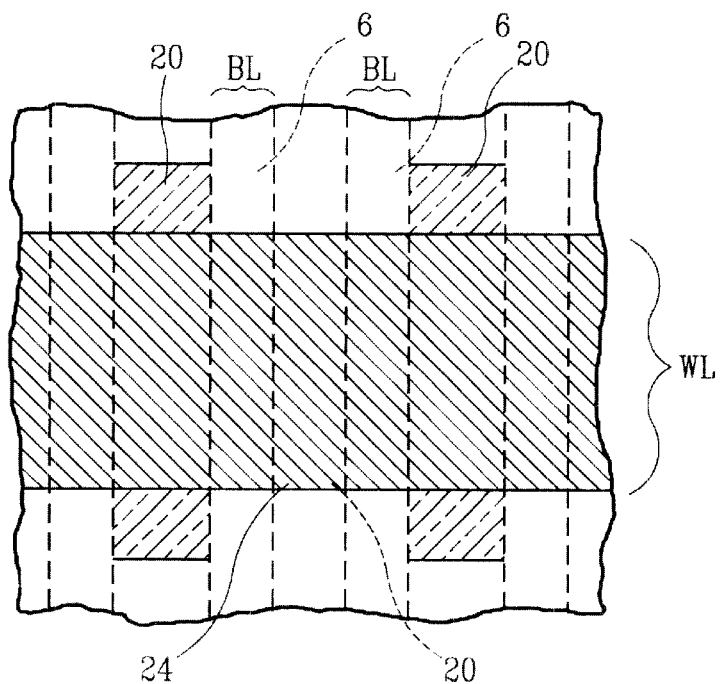

Referring to FIGS. 8–9, a memory array is illustrated. The memory array includes rows and columns structure. Each source/drain 6 is formed in the trench to act as bit line (BL) and separated by floating gate 20. A word line (WL) is formed by the layer 24 for forming the control gate. Namely, the patterned second conductive layer 24 forms the control gates and the word lines of the memory array. The sources/drains of the devices form the bit lines of the memory array.

As will be understood by persons skilled in the art, the foregoing preferred embodiment of the present invention is illustrative of the present invention rather than limiting the present invention. Having described the invention in connection with a preferred embodiment, modification will now suggest itself to those skilled in the art. Thus, the invention is not to be limited to this embodiment, but rather the invention is intended to cover various modifications and similar arrangements included within the spirit and scope of the appended claims, the scope of which should be accorded the broadest interpretation so as to encompass all such modifications and similar structures.

While the preferred embodiment of the invention has been illustrated and described, it will be appreciated that various changes can be made therein without departing from the spirit and scope of the invention.

What is claimed is:

1. A method for manufacturing a nonvolatile memory on a semiconductor substrate, said method comprising the steps of:
   forming doped regions in said semiconductor substrate;
   forming a pad oxide layer on said semiconductor substrate;
   forming a masking layer on said pad oxide layer;
   patterning said masking layer, said pad oxide layer and said semiconductor substrate to form a trench therein;
   forming a gap-filling material into said trench and over said semiconductor substrate;
   removing a portion of said gap-filling material to expose an upper surface of said masking layer;
   removing said masking layer;
   forming a first conductive layer along the surface of said semiconductor substrate;
   removing a portion of said first conductive layer to expose an upper surface of said gap-filling material;
   etching portion of said gap-filling material to form a downward portion into said gap-filling material, thereby exposing the sidewall surface of said first conductive layer;
   forming an inter polysilicon dielectric layer on said first conductive layer and over said downward portion; and
   forming a second conductive layer on said inter polysilicon dielectric layer.

2. The method of claim 1, wherein said masking layer comprises nitride.

3. The method of claim 2, wherein said masking layer is removed by hot phosphorus acid solution.

4. The method of claim 1, wherein said thin dielectric layer comprises silicon oxide.

5. The method of claim 1, wherein said inter polysilicon dielectric layer comprises ONO (oxide/nitride/oxide).

6. The method of claim 1, wherein said inter polysilicon dielectric layer comprises ON (oxide/nitride).

7. The method of claim 1, wherein said first conductive layer comprises polysilicon.

8. The method of claim 1, wherein said second conductive layer comprises polysilicon.

9. The method of claim 1, wherein said gap-filling material is removed by chemical mechanical polishing (CMP).

10. The method of claim 1, wherein said first polysilicon layer is removed by chemical mechanical polishing (CMP).

11. A method for manufacturing a stacked gate for a nonvolatile memory on a semiconductor substrate, said method comprising the steps of:
    forming doped regions in said semiconductor substrate;
    forming a pad oxide layer on said semiconductor substrate;
    forming a masking layer on said pad oxide layer;
    patterning said masking layer, said pad oxide layer and said semiconductor substrate to form a trench therein;
    forming a gap-filling material into said trench and over said semiconductor substrate;
    removing a portion of said gap-filling material to upper surface of said masking layer;
    removing said masking layer;
    forming a first conductive layer along the surface of said semiconductor substrate;
    removing a portion of said first conductive layer to expose an upper surface of said gap-filling material; and
    etching portion of said gap-filling material to form a downward portion into said gap-filling material, thereby exposing the sidewall surface of said first conductive layer.

12. The method of claim 11, wherein said masking layer comprises nitride.

13. The method of claim 12, wherein said masking layer is removed by hot phosphorus acid solution.

14. The method of claim 12, wherein said gap-filling material is removed by chemical mechanical polishing (CMP).

15. The method of claim 12, wherein said first polysilicon layer is removed by chemical mechanical polishing (CMP).

* * * * *